United States Patent [19]

Sturzebecher et al.

[11] Patent Number: 5,302,918

[45] Date of Patent: Apr. 12, 1994

[54] SUBHARMONIC OPTICALLY INJECTION LOCKED OSCILLATOR

[75] Inventors: Dana J. Sturzebecher; Thomas P. Higgins, both of Tinton Falls, N.J.; Afshin S. Daryoush, Shaker Heights, Ohio

[73] Assignee: The United States of America as represented by the Secretary of the Army, Washington, D.C.

[21] Appl. No.: 71,412

[22] Filed: Jun. 1, 1993

[51] Int. Cl.$^5$ .............. H03B 5/18; H03C 3/22; H03L 7/093; H03L 7/24

[52] U.S. Cl. .................. 331/10; 331/17; 331/23; 331/25; 331/36 C; 331/66; 331/117 D; 331/177 V; 332/128; 332/130; 332/136

[58] Field of Search ............... 331/10, 17, 18, 23, 331/25, 36 C, 66, 96, 99, 117 D, 177 V; 332/127, 128, 130, 136

[56] References Cited

U.S. PATENT DOCUMENTS 4,074,209  2/1978  Lysobey ............... 331/36 C X
5,144,261  9/1992  Harvey et al. ............... 331/66

OTHER PUBLICATIONS

Esman et al, "Optical Phase Control of an Optically Injection-Locked FET Microwave Oscillator", IEEE Transactions on Microwave Theory and Techniques, vol. 37, No. 10, Oct. 1989; pp. 1512-1518.
Mizuno, "Microwave Characteristics of an Optically Controlled GaAs MESFET", IEEE Transactions on Microwave Theory and Techniques, vol. MTT-31, No. 7 pp. 596-599, Jul. 1983.
de Salles, "Optical Control of GaAs MESFETs", IEEE Transactions on Mircowave Theory and Techniques, vol. MTT-31, pp. 812-820, Oct. 1983.
Gautier et al, "Optical Effects of the Static and Dynamic Characteristics of GaAs MESFET", IEEE Transactions on Microwave Theory and Techniques, vol. MTT-33, pp. 819-822, Sep. 1985.
Higgins, "Direct Optical Subharmonically Injection-Locked MESFET Oscillators", Microwave and Optical Technology Letters, vol. 6, No. 1, Jan. 1993, pp. 33-36.

Primary Examiner—Siegfried H. Grimm
Attorney, Agent, or Firm—Michael Zelenka; William H. Anderson

[57] ABSTRACT

A fundamental or subharmonic optically injection locked oscillator is coupled to a phase locked loop circuit. The injection locked oscillator has two single stage HEMT amplifiers with parallel feedback from the drain of a second transistor to a gate of a first transistor. A feedback resonant network controls the oscillator frequency. A microwave/millimeter wave source modulates a laser diode and the signal from the laser diode is then transmitted via an optical fiber to a PIN photodetector diode. The signal from the photodetector diode is injected into the oscillator at an nth subharmonic of the oscillator frequency. The feedback network may consist of a microstrip gap resonator with two tuning varactors at the ends of the resonator. The phase locked loop includes a balanced mixer used as a phase detector to compare the nth harmonic of the signal from the photodetector diode to the sampled output of the oscillator. The output of the mixer is applied to the varactor diodes after being filtered, and a voltage reference is added to the filtered signal to prebias the varactor diodes to the desired frequency of operation.

5 Claims, 8 Drawing Sheets

SUBHARMONIC OPTICALLY INJECTION LOCKED OSCILLATOR

GOVERNMENT INTEREST

The invention described herein may be made, used, sold and/or licensed by, or on behalf of, the Government of the United States of America without the payment to us of any royalties thereon.

FIELD OF THE INVENTION

The present invention relates to microwave/millimeter wave oscillators and more specifically to optically injection locked oscillators which can be used as phase and frequency coherent oscillators, phase shifters, and self oscillating mixers.

BACKGROUND OF THE INVENTION

It is known that the frequency of an oscillator can be locked to the frequency of variations in the intensity of light in an optical signal injected into the active circuit by either direct or indirect illumination of the active element. For any given amount of modulated light intensity, there is a given bandwidth of frequencies ($\Delta f$), called the locking bandwidth, to which the oscillator can be locked. The phase and frequency coherency of these modules can be efficiently obtained by subharmonic injection locking of the local oscillators (LO) via a fiber optic link. The local oscillator can be parametrically stabilized to a reference signal using the nonlinearity of both optical (lasers, electro-optic modulators) and electronic devices (such as HEMT, FET, HBT) in a fiber optic fed phased array architecture. More specifically, laser and FET nonlinearities create harmonics of the reference signal close to the oscillation frequency of the local oscillator, which results in the fundamental injection locking of the local oscillator and which also results in the subharmonic injection locking with respect to the synchronizing frequency reference.

As those skilled in the art will know, the locking range and noise behavior of subharmonic injection locked local oscillators are highly dependant on the oscillator device nonlinear behavior and the parameters of the feed back network. Therefore, even though the injection locked oscillator will provide frequency synchronization, the initial frequency detuning between the free running oscillation and the synchronizing signal will cause an unwanted phase shift of $+/-\pi/2$ over the locking range.

Using a directly modulated laser diode, FET oscillator locking has been demonstrated at frequencies up to 15 GHz. See Higgins, "Direct Optical Subharmonically Injection Locked MESFET Oscillators," *Microwave and Optical Technology Letters*, Vol. 6, No. 1, January, 1993. Higher locked frequencies are possible, however, the narrow locking range attainable render the method impractical. See Mizuno, "Microwave Characteristics of an Optically Controlled GaAs MESFET," *IEEE Transactions on Microwave Theory and Techniques*, Vol. MTT-31, pp. 596–600, July 1983; de Salles, "Optical Control of GaAs MESFETS," *IEEE Transactions on Microwave Theory and Techniques*, Vol. MTT-31, pp. 812–820, October 1983; and Gautier et al, "Optical Effects of the Static and Dynamic Characteristics of GaAs MESFET," *IEEE Transactions on Microwave Theory and Techniques*, Vol. MTT-33, pp. 819–822, September 1985, respectively. Also see Esman et al, "Optical Phase Control of an Optically Injection-Locked FET Microwave Oscillator," *IEEE Transactions on Microwave Theory and Techniques*, Vol. 37, No. 10, October 1989.

These optically injection-locked oscillators are attractive prospects for airborne and space communications, radar, imaging and surveillance applications since the locking signal can be distributed using light weight optical fiber. The growing availability of wide-bandwidth laser diodes has further stimulated interest in this injection locking technique. However, the potential applications for this injection locking technique, such as phased array radar and microwave power combining, require not only frequency-locked (coherent) sources but also individual source phase control. Thus, optical techniques for phase control have been generally limited to optically controlled varactors and to fiber stretching and fiber length switching techniques. These techniques suffer from a number of drawbacks, including limited phase shifts, discrete phase shifts, slow response, moderate to prohibitive insertion loss, high voltage requirements, and small phase modulation bandwidths, as well as the size and weight of the additional components required.

Therefore, there exists a need to provide for a synchronized optically controlled microwave/millimeter wave oscillator which serves as a single component for the front end of a microwave transmission system that can act as a stable oscillator, mixer and a phase shifter. The present invention fulfills these needs.

SUMMARY OF THE INVENTION

Accordingly, one object of the invention is to provide for remote phase and frequency synchronization of microwave and millimeter wave oscillators using a fundamental or subharmonic reference signal delivered via an optical fiber.

Another object of the present invention is to provide for such an oscillator which can act as a 360° phase shifter, a mixer, as well as a phase and frequency stable oscillator.

These and other objects of the invention are achieved by the present invention wherein a fundamental or subharmonic optically injection locked oscillator is coupled with a phased locked loop circuit.

In the preferred embodiment, the subharmonic optically injection locked oscillator is constructed by integrating two single stage HEMT amplifiers with parallel feed-back from the drain of a second transistor to a gate of a first transistor. A feed-back resonant network controls the oscillator frequency. A microwave/millimeter wave source modulates a laser diode and the signal from the laser diode is then transmitted via an optical fiber to PIN photodetector diode. The synchronizing signal is injected to the oscillator by building a transimpedance matching circuit between the photodetector diode and input couplers at an $n^{th}$ subharmonic of the local oscillator frequency. A first impedance matching network is also made to match the gate of the first transistor. Further, a second impedance matching network is used to match the drain of the first transistor with the gate of the second transistor. The drain of the second transistor is then impedance matched to the output coupler and feedback network which distributes the amplified fundamental signal into the output of the oscillator and into the feedback network. In the preferred embodiment, the feed-back loop consists of a microstrip gap resonator with two tuning varactors at the ends of the resonator.

The feed-back loop is connected to the gate of the first transistor through a hybrid coupler operating at 9 and 18 GHz.

Phase synchronization is obtained by applying a phase lock loop to the varactor controlled oscillator. The phase synchronization is obtained by the phase comparison of $\omega_{inj}*n$ (n=the subharmonic) sampled at the output of the transimpedance amplifier network with a 10 dB coupler, with $\omega_{LO}$, which is sampled at the output of the oscillator, by a 20 dB coupler. A balanced mixer is used as a phase detector and compares the input reference signal, which is multiplied by the $n^{th}$ harmonic, to the sampled output of the oscillator. (The IF signal out of the mixer, the phase error information, is a D.C. voltage when the oscillator is injection locked by the source reference signal.) The IF signal is then filtered using a low pass filter and is amplified using operational amplifiers. A voltage reference input is used to prebias the varactor diodes to the desired frequency of operation. The amplified signal is then again low pass filtered and is connected to the varactors to adjust the resonant frequency of the feed-back network by adjusting the capacitance of the varactor diodes.

Once phase control is obtained, 180° phase shifting is implemented by inserting a reference voltage into the feed-back path of the operational amplifier in the phased locked loop circuit. An additional 180° phase shift is achieved by injection locking a second oscillator with the first oscillator as a subharmonic reference, thereby achieving a 360° phase shift. Moreover, with this configuration mixing of the stabilized local oscillator with an RF or IF signal may be achieved for up or down conversion.

BRIEF DESCRIPTION OF THE DRAWINGS

These and other features of the invention will be more readily understood in light of the Detailed Description of the Invention and attached drawings wherein.

DETAILED DESCRIPTION OF THE INVENTION

Figure 1:
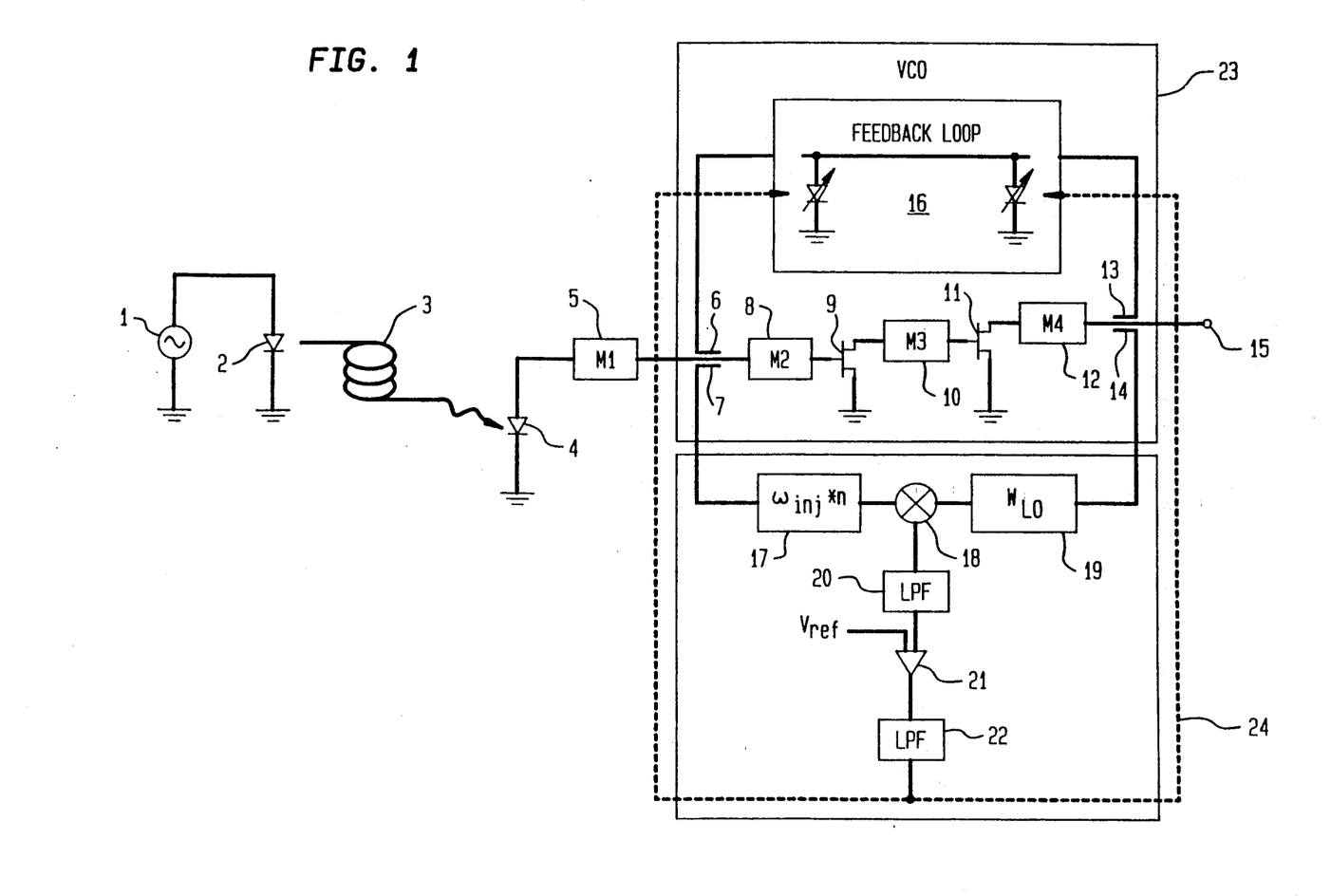
FIG. 1 is a schematic diagram of the present invention.

Now referring to FIG. 1, there is shown a schematic representation of the preferred embodiment of the present invention. A microwave/millimeter wave modulator 1 is coupled to a laser diode 2 which is, in turn, coupled to a PIN diode photodetector 4 via optical fiber 3. A synchronizing signal, which is generated by the microwave/millimeter wave modulator, is injected into the voltage controlled oscillator (VCO) 23 through the laser diode-optical fiber-PIN diode photodetector assembly and by building a transimpedance matching network 5 between the photodetector 4 and input couplers 6 and 7 at an $n^{th}$ subharmonic of the local oscillator frequency. Preferably, the input coupler 6 is a 3 dB hybrid coupler operating at 9 and 18 GHz and coupler 7 is a 10 dB coupler. The coupled signal is then impedance matched to the gate of a first transistor 9 via a first impedance matching network 8. A second impedance matching network 10 is coupled to the drain of the first transistor 9 so as to match the drain of the first transistor 9 to the gate of a second transistor 11. (As those skilled in the art will readily appreciate, examples of the transistors which may be used in this circuit include such transistors as HEMTs, FETs, or HBTs.) Further, the drain of the second transistor 11 is impedance matched to preferably 50 ohms by a third matching network 12.

The amplified signal is then directed through the feed-back loop 16 by a 3 dB hybrid coupler 13 which operates at the oscillation frequency, for example 18 GHz. The feed-back loop is, in turn, connected back to the gate of the first transistor 9 through hybrid coupler 6. The feed-back loop 16 is preferably comprised of a microstrip gap resonator with two tuning varactors coupled to the resonator at both of its ends.

In order to obtain phase synchronization of the VCO 23, a phase locked loop is coupled to the input and output of the VCO by two couplers, a 10 dB coupler at the input 7, and a 20 dB coupler at the output 14, respectively. Phase synchronization is obtained by the phase comparison of $\omega_{inj}*n$ (which is sampled at the output of the 10 dB coupler) with $\omega_{LO}$ (which is sampled at the output of the VCO 23 with a 20 dB coupler 14). A balanced mixer 18 is used as a phase detector and compares the input reference signal multiplied by n to the sampled output of the oscillator. The resulting IF signal is a phase error signal and comes from the balanced mixer 18 which is fed through a low pass filter 20 and into an operational amplifier with a voltage reference input. (The voltage reference is used to prebias the varactor tuning diodes in the feed-back loop 16 to the desired frequency of operation.) The amplified signal is then sent through another low pass filter 22 and is connected to the varactors to adjust the resonant frequency of the feed-back loop 16 adjusting the capacitance of the varactor diodes.

For purposes of demonstrating the functionality of the above described oscillator, two MIC based 18 GHz oscillators were designed and fabricated on RT/Duroid ™ in accordance with the above description. The resonator used in these oscillators was a $\pi/2$ open transmission line with a Q factor of approximately 100. A fiber-optic link was set up for the reference signal distribution in order to examine the validity of the optically injection locked phased locked loop technique, as shown in FIG. 1. In this link, an Ortel laser diode (model #SL1020) was driven with 7 dBm of power at 4.5 GHz. The optical signal was routed through 50 meters of optical fiber and then detected using an Ortel photodetector (model #2210B-E001). An insertion loss of −50 dB at 4.5 GHz was measured. By taking advantage of the multiplication factor of 2 due to the laser non-linearities, a −60 dBm 9 GHz reference signal was obtained at the output of the detector. This signal was then amplified by 50 dB using two 9 GHz amplifiers, and then injected into the oscillator.

I. Phase Shift Control Using Injection Locking Techniques

Figure 2:
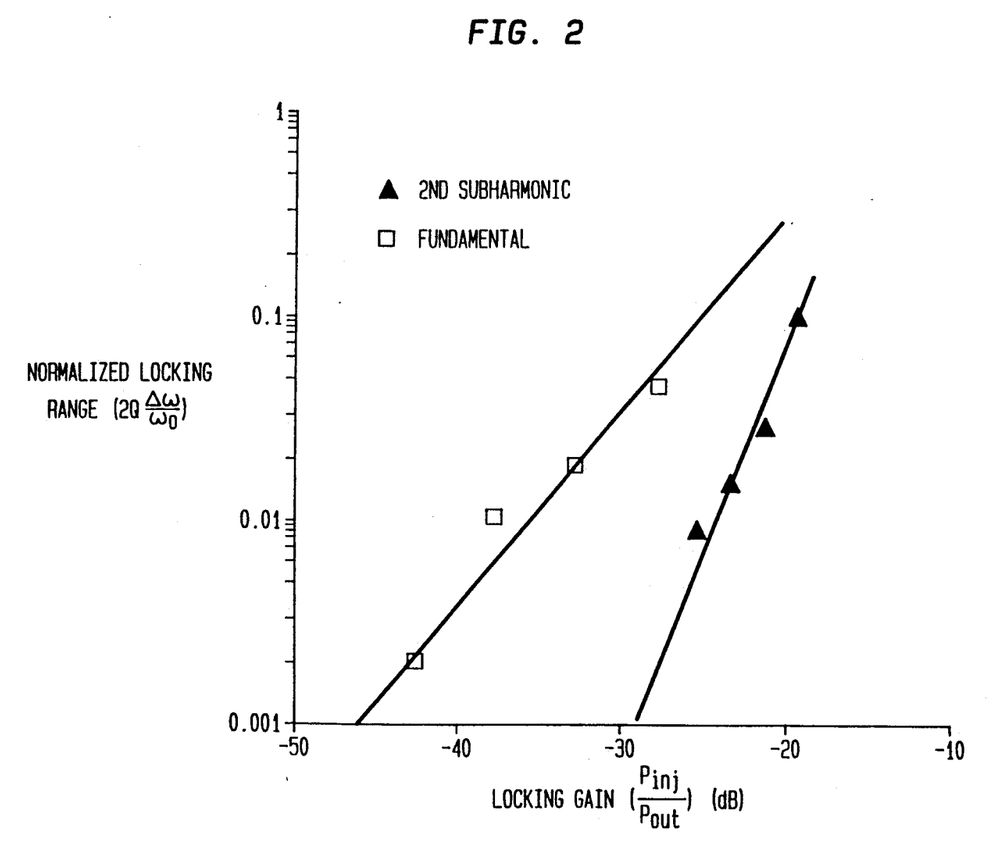
FIG. 2 is a graphical representation of the normalized locking range of the first oscillator as a function of the locking power gain for a fundamental and second harmonic frequency.

Phase shift control of the above described oscillators may be achieved by taking advantage of the phase shift controlled by the detuning frequency. Both oscillators were injection locked with the same subharmonic reference signal of 9.144 GHz at a power level of −10 dBm. A network analyzer, with a harmonic frequency converter was used to monitor the phase shift of the oscillator. A sample of the injection signal was doubled in frequency and then compared with a sample output of the oscillator at the converter. FIG. 2 illustrates the normalized locking range of the first oscillator at 18 GHz as a function of the locking power gain ($P_{inj}/P_{out}$) for the fundamental and the second subharmonic frequency.

Figure 3:
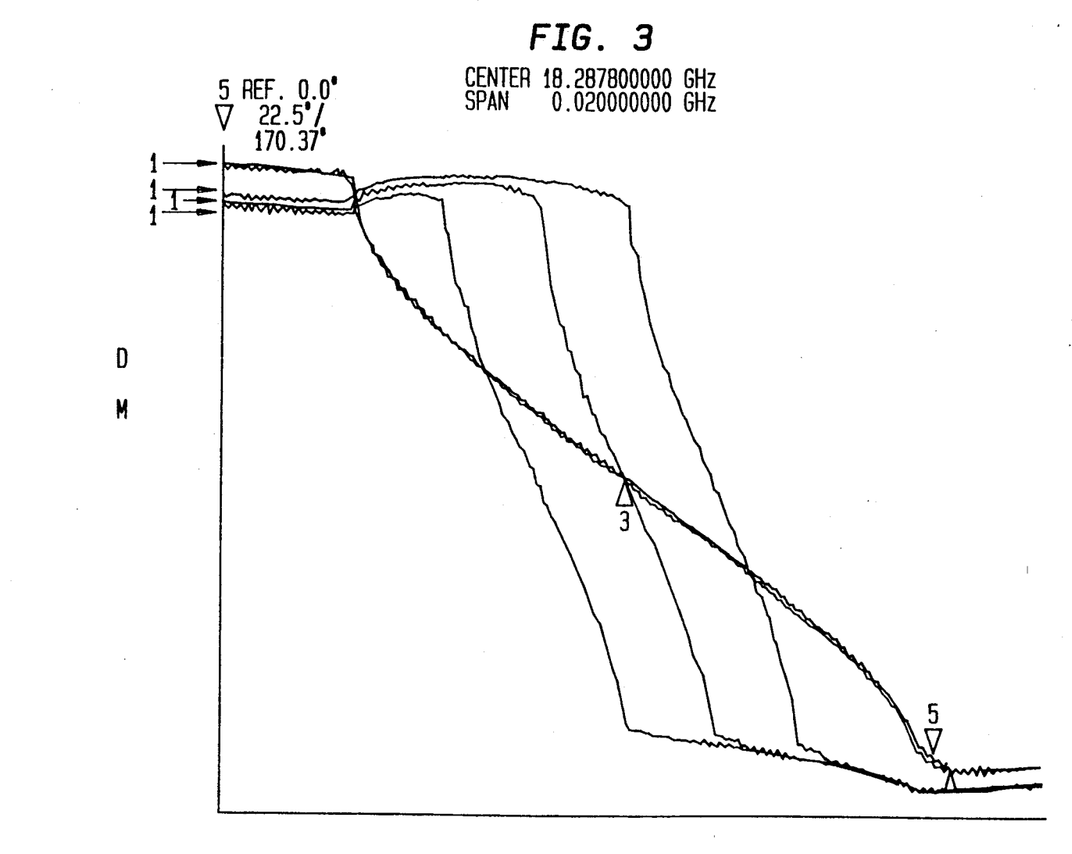
FIG. 3 illustrates the phase responses of two oscillators according to the present invention which have been subharmonically injection locked.

FIG. 3 shows the phase response of the two oscillators while being subharmonically injection locked. From the plot, a 2nd order subharmonic locking range of 14 MHz and 4 MHz was achieved for the first and second oscillators, respectively. This phase difference, $\phi_{detuning}$, varies with detuning frequency of $\delta\omega = \omega_o - n\cdot\omega_{inj}$, where $w_o$ is free-running oscillation frequency, $\omega_{inj}$ is injection frequency. This phase shift is expressed in terms of injection locking range $\delta\omega_{1/n}$ as:

$$\phi_{detuning} = \sin^{-1}\left(\frac{\delta\omega}{\Delta\omega_{1/n}}\right)$$

Figure 4:
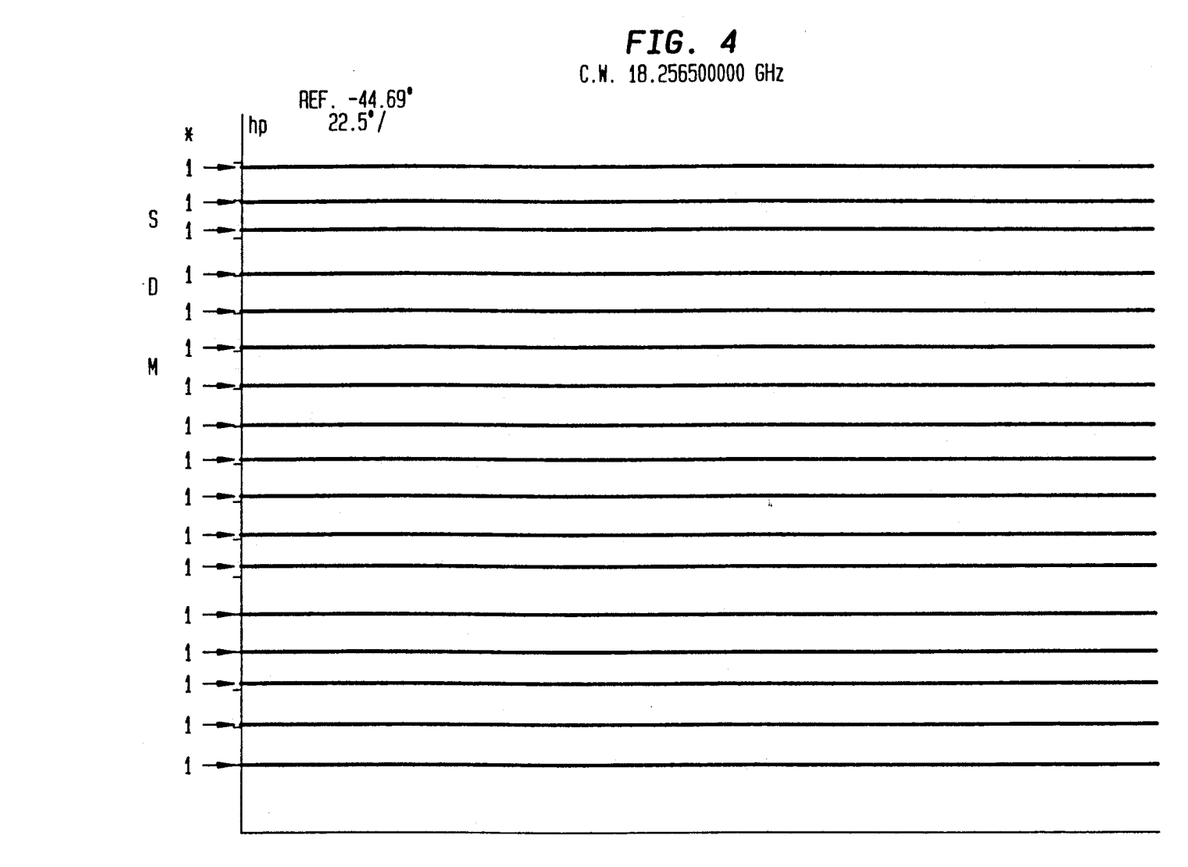
FIG. 4 depicts phase control of the present invention in discrete steps of 11.25°

While the free-running oscillation frequency of the first oscillator was set at 18.288 GHz, the free running oscillation frequency of the second oscillator was tuned by changing the bias voltage on its varactor diode. Since the reference frequency of the injected signal is fixed at 9.144 GHz, the phase of the injection locked first oscillator can be considered as a reference. Therefore, as result of the frequency tuning of the second oscillator, a phase difference of ±90° is observed between the two oscillators, thereby achieving continuous phase shifts over a 180° range. This is depicted in FIG. 4 wherein the phase control of the oscillators are illustrated in discrete steps of 11.25°. This method of phase shifting is an analog technique of controlling the phase of the local oscillators, and therefore reduces the high bit number requirements for the MMIC based time delay phase shifters in active phased array antennas. Also as shown in FIG. 3, a greater phase control (i.e. a slower rate of change for $\phi_{detuning}$ with respect to $d\omega$) can be achieved for a larger locking range. Therefore, high resolution in phase shifting would translate to a large locking range in phased array antennas.

Figure 5:
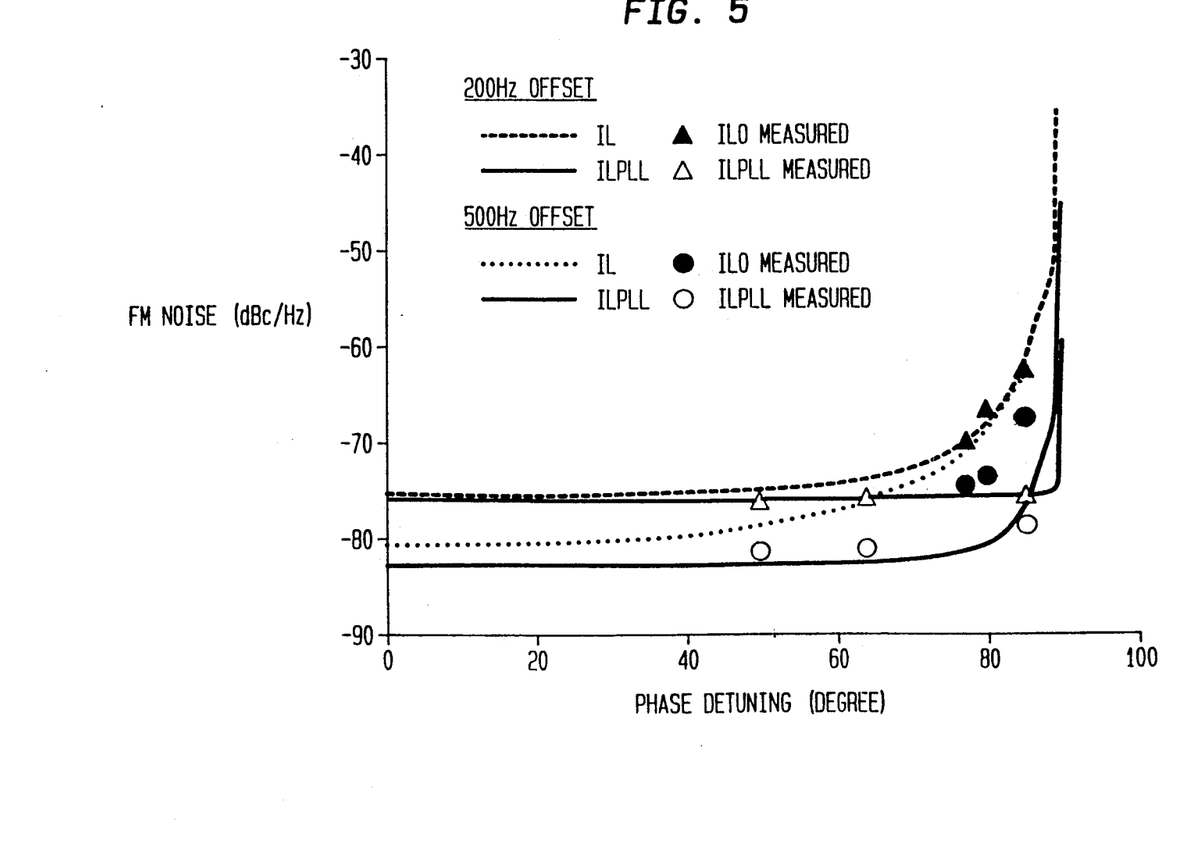
FIG. 5 shows the measured and predicted FM noise levels of the first oscillator as a function of phase shift.

However, it should be mentioned that without the injection locked phase locked loop circuit (ILPLL) FM noise degradation will occur at large phase shifts. More specifically, the close-in carrier phase noise is expressed as:

$$\mathcal{L}_{1/n}(\Omega) = \frac{n^2 \mathcal{L}_r(\Omega)\Delta\omega_{1/n}^2 \cos^2\phi_{detuning} + \Omega^2 \mathcal{L}_o(\Omega)}{\Omega^2 + \Delta\omega_{1/n}^2 \cos^2\phi_{detuning}}$$

Where $\mathcal{L}_{1/n}(\Omega)$ is the FM noise of the nth order subharmonic injection locking oscillator; $\Omega$ is the offset carrier frequency of the noise signal, and $\mathcal{L}_r$ is the FM noise ratio of the input signal. The $\mathcal{L}_o(\Omega)$ denotes the FM noise caused by the intrinsic noise of the free running oscillator. Clearly, when $\phi_{detuning}$ is close to ±90°, the contribution of $\mathcal{L}_r$ to the overall spectral purity of the IL oscillator becomes weak; so that the effect of the intrinsic noise $\mathcal{L}_o(\Omega)$ becomes significant enough to increase the IL oscillator's FM noise level. Therefore, without the ILPLL, this phase noise degradation caused by the frequency detuning can limit the useful phase shifting range to only ±45°[4]. FIG. 5 shows the measured and predicted FM noise levels of the first oscillator as a function of phase shift. A 10 dB FM noise degradation is measured for the phase shift of 85°. The experimental result agrees very well with the predicted results. Furthermore, since the free-running frequency is always influenced by environmental variation (temperature and mechanical vibration) significant phase error will occur due to the changes in the free-running oscillation frequency.

As those skilled in the art will recognize, the present ILPLL oscillators will overcome the noise degradation for phase shifts close to ±90° and to minimize the amount of phase error due to the environmental effects.

II. Phase and Frequency Synchronization (ILPLL)

Figure 6:
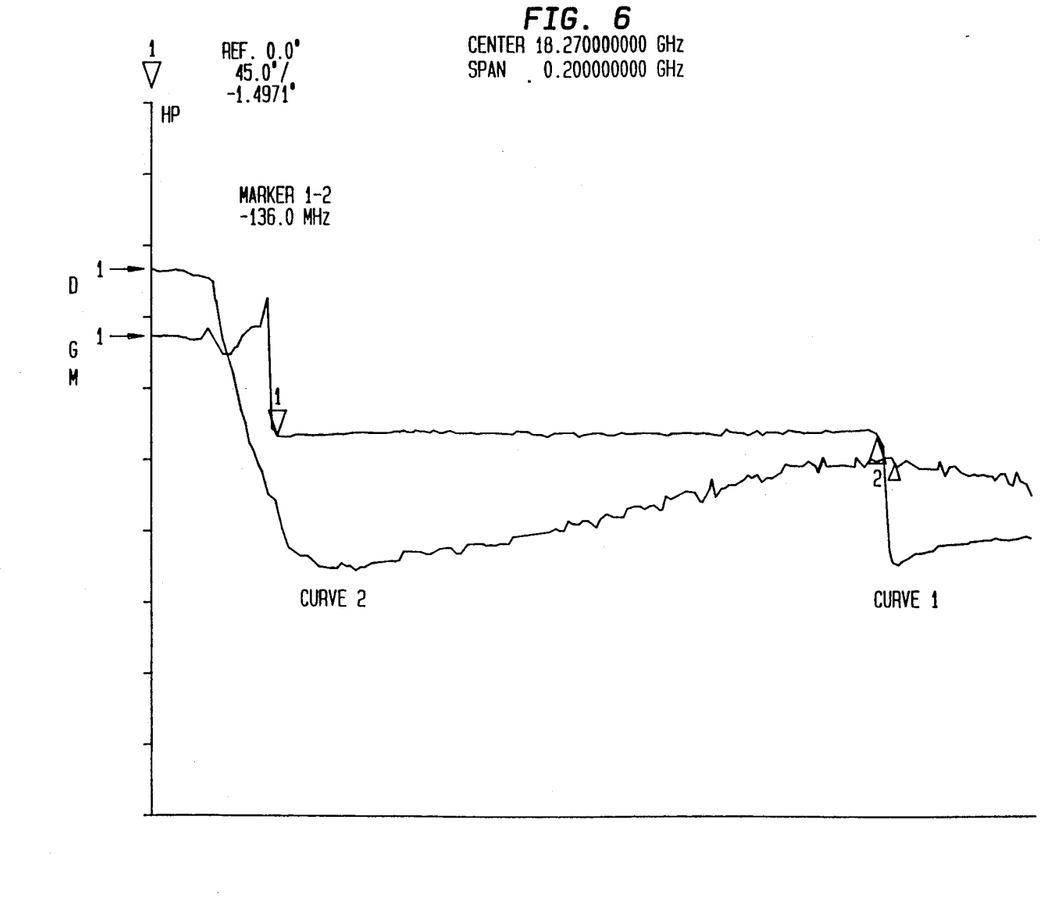
FIG. 6 shows the comparison of the phase response of the subharmonic optically injection locked oscillator with and without the phase-lock-loop applied.
Figure 7:
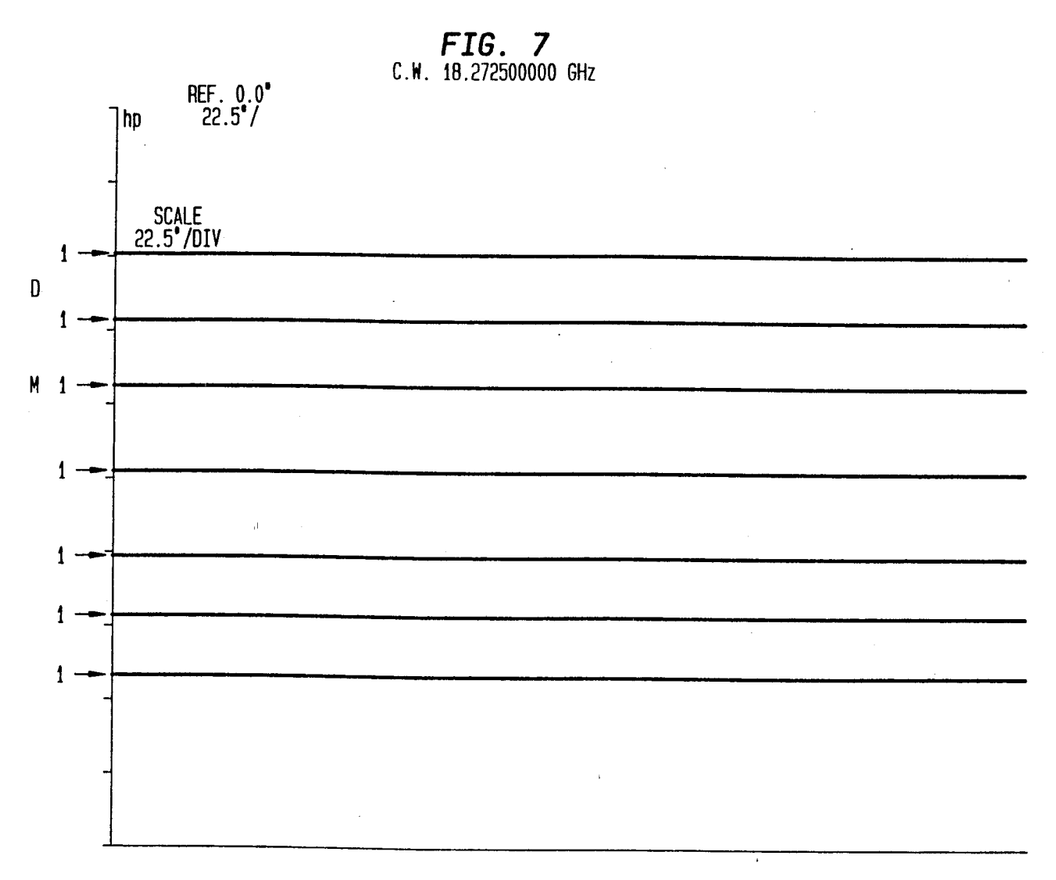
FIG. 7 shows a reference phase shift of approximately ±67.5 degrees by applying an offset voltage of ±0.7 V to the reference port of the op-amp.

FIG. 6 shows the comparison of the phase response of the subharmonic optically injection locked oscillator with and without the phase-lock-loop applied. It is important to notice that the oscillator is frequency and phase synchronized over an enhanced locking range of 136 MHz. The phase error caused by the free-running frequency jitter is also removed. Furthermore, now a phase shift can be selected by applying a reference voltage to the op-amp. FIG. 7 shows a reference phase shift of approximately ±67.5 degrees by applying an offset voltage of ±0.7 V to the reference port of the op-amp.

By combining the injection locking and PLL together, the phase spectral purity of the oscillator is further improved as compared to a conventional PLL or IL oscillator. The FM noise of a conventional phase lock loop is given as:

$$\mathcal{L}_{PLL}(\Omega) = n^2 \mathcal{L}_r(\Omega)|H(j\Omega)|^2 + |1 - H(j\Omega)|^2 \mathcal{L}_o(\Omega)$$

where $\mathcal{L}_{PLL}(\Omega)$ is the FM noise to carrier ratio for the reference signal at $\Omega$ offset carrier frequency. $H(j\Omega)$ is the close-loop transfer function of the PLL. For a second-order loop, H(s) is presented as:

$$H(s) = \frac{\omega_{nO}^2}{s^2 + \xi\omega_{nO}s + \omega_{nO}^2}$$

where $\omega_{no}$, $\xi$ are the natural resonant frequency, and the damping factor of the PLL, respectively. In this experiment, fnO = 1.13 kHz and $\xi = 3.2 \times 10^{-4}$. Therefore, the FM noise spectrum of the PLL is:

$$\mathcal{L}_{PLL}(\Omega) = \frac{n^2\omega_{nO}^4 \mathcal{L}_r(\Omega) + \Omega^4 \mathcal{L}_o(\Omega)}{(\Omega^2 + \omega_{nO}^2)^2}$$

when fn is large enough compared with $\Omega$, the loop FM noise will be reduced by a clean reference signal. When the injection locking is applied to the PLL oscillator as described above, the term $\mathcal{L}_o(\Omega)$ used above, which represents intrinsic FM noise of the oscillator, has to be changed to the FM noise of the phase locked oscillator which is also expressed above. By substituting the two terms, the output FM noise of the present ILPLL oscillator can be found as:

$$ILPLL(\Omega) = \frac{n^2 \;_r(\Omega)\Delta\omega^2_{1/n}\cos^2\phi_{detuning} + \Omega^2 \;_{PLL}(\Omega)}{\Omega^2 + \Delta\omega^2_{1/n}\cos^2\phi_{detuning}}$$

Figure 8:
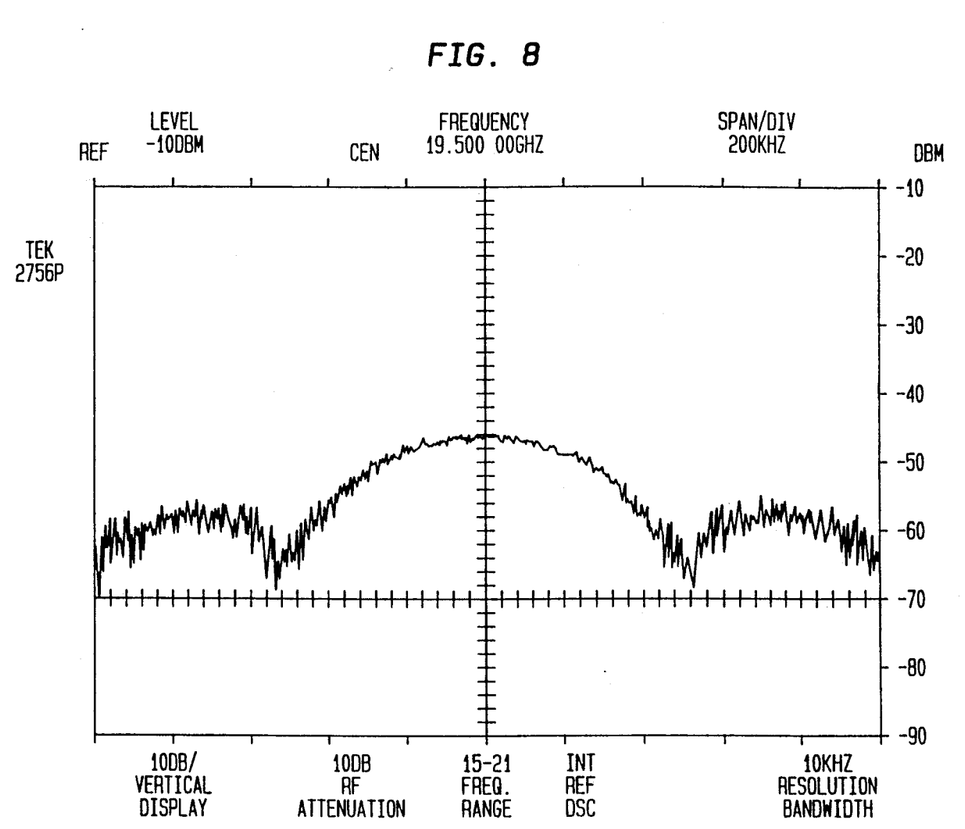
FIG. 8 represents the spectrum of the RF and IF signal while self mixing.

Since the $_{PLL}(\Omega)$ is much smaller than the free-running FM noise, at phase shifts close to $\pm 90°$, the output noise can still remain at a low level. Therefore, the phase shift error induced by frequency detuning of the injection locked oscillator can be overcome by the present ILPLL oscillators. FIG. 5 shows the measured and predicted FM noise to carrier ratios at 200 Hz offset carrier frequency of the ILPLL oscillator. The FM noise levels of the reference signal $_r(\Omega)$ at 9 GHz are $-82$ dBc/Hz and $-88$ dBc/Hz at 200 Hz and 500 Hz offset carrier frequencies, respectively. It should be noticed that the measured results verified the theoretical prediction very well. From the 0° to 85° phase shift range, the FM noise always remains the minimum level which is 20Log(n)x $_r(\Omega)$. The FM noise level of ILPLL at 85°) phase shift is 10 dB lower than that of the IL oscillator. It should be noted that the ILPLL oscillator has a 25 dB lower FM noise level, at 1.0 KHz offset carrier, than the conventional PLL oscillator. Detailed measurement results comparing the conventional PLL to the ILPLL will not be discussed here. III. RF/IF signal mixing with the stabilized LO The stabilized LO can also be used as a self mixing oscillator. A pulsed 19.5 GHz RF signal was fed into the ILPLL oscillator operating at 18.182 GHz, at the injection locking port of the oscillator. Since the two HEMT devices are saturated, the RF input can mix with the LO to produce the IF signals. The downconverted signal at 1.318 GHz was measured out of the fourth port of the output 3 dB hybrid. FIG. 8 shows the spectra of the input RF signal and output IF signal. The measured conversion loss of the mixer is 40 dB, and is predominantly due to losses of the 18 GHz bandpass and coupled line filters in the circuit, which reduces both the amount of coupling of the input RF signal before mixing and the IF signal after mixing. A simulation has indicated the insertion loss due to the output coupled line filter and 3 dB branchline coupler at 1.317 GHz is 49.5 dB. This result points to a possible 10 dB of conversion gain out of this self-mixing oscillator. Improvement in mixing performance can be obtained by a new design using capacitors instead of coupled line filters as DC blocks.

What is claimed is:

1. A multi functional injection locked oscillator comprising:
    means to provide an injected optical signal of a predetermined frequency and phase;
    a voltage controlled oscillator having a transistor network, a feedback loop having a tunable element, and an output wherein the output is connected to the transistor network and feedback loop, the voltage controlled oscillator being connected to the means to provide an optical signal; and
    phase locked loop circuitry connected to the feedback loop of the voltage controlled oscillator such that any difference between the phase of the injected signal and the output of the voltage controlled oscillator is recognized as a voltage to adjust the tunable element of the feedback loop so as to equalize the phase of the injected signal and the output of the voltage controlled oscillator.

2. The multi functional injection locked oscillator of claim 1 wherein the means to provide an optical signal comprises a microwave/millimeter wave modulator coupled to a laser diode which is coupled to a PIN diode photodetector via an optical fiber.

3. The multi functional injection locked oscillator of claim 1 further comprising a variable voltage bias means connected to the phase locked loop circuitry so as to vary said recognized voltage and further adjust the phase of the injected signal or output signal of the voltage controlled oscillator.

4. The multi functional injection locked oscillator of claim 2 wherein the feedback loop consists of at least two varactors as the tunable element connected on either side of a resonator.

5. The multi functional injection locked oscillator of claim 4 wherein the phase locked loop circuitry comprises a mixer of the injected signal and the output signal of the voltage controlled oscillator, a first low pass filter connected to the mixer, a voltage reference means connected to the first low pass filter and a second low pass filter connected to the voltage reference means.

* * * * *